US012562726B2

(12) United States Patent
Lee

(10) Patent No.: US 12,562,726 B2
(45) Date of Patent: Feb. 24, 2026

(54) CLOCK GENERATOR AND VOLTAGE GENERATION CIRCUIT INCLUDING THE SAME

(71) Applicant: SK hynix Inc., Icheon-si (KR)

(72) Inventor: Junghan Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 149 days.

(21) Appl. No.: 18/490,579

(22) Filed: Oct. 19, 2023

(65) Prior Publication Data

US 2024/0421808 A1 Dec. 19, 2024

(30) Foreign Application Priority Data

Jun. 15, 2023 (KR) ........................ 10-2023-0076773

(51) Int. Cl.
*H03K 5/24* (2006.01)
*H02M 3/07* (2006.01)
*H03K 5/156* (2006.01)
*H04N 25/76* (2023.01)
*H04N 25/78* (2023.01)

(52) U.S. Cl.
CPC ................ *H03K 5/24* (2013.01); *H02M 3/07* (2013.01); *H03K 5/1565* (2013.01); *H04N 25/7795* (2023.01); *H04N 25/78* (2023.01)

(58) Field of Classification Search
CPC .... H03K 5/24; H03K 5/1565; H03K 5/15006; H03K 5/22; H03K 3/53; H02M 3/07; H04N 25/7795; H04N 25/78
See application file for complete search history.

(56) References Cited

U.S. PATENT DOCUMENTS

| | | | | | |
|---|---|---|---|---|---|
| 9,048,821 | B2* | 6/2015 | Sinitsky | ............... | H03K 3/0231 |
| 10,833,665 | B2 | 11/2020 | Jiang | | |
| 2014/0144230 | A1* | 5/2014 | Magnoni | ............ | G01C 19/5726 |
| | | | | | 73/504.12 |
| 2019/0319611 | A1* | 10/2019 | Sim | ..................... | H03K 3/02315 |
| 2023/0402921 | A1* | 12/2023 | Wu | ......................... | H02M 3/07 |

FOREIGN PATENT DOCUMENTS

| | | |
|---|---|---|
| KR | 101933645 B1 | 12/2018 |
| KR | 102016725 B1 | 9/2019 |

* cited by examiner

*Primary Examiner* — Sibin Chen
(74) *Attorney, Agent, or Firm* — WILLIAM PARK AND ASSOCIATES LTD.

(57) ABSTRACT

A clock generator includes a voltage supply circuit configured to generate a control voltage based on a first current and a control signal. The clock generator also includes a first clock output circuit configured to output the control signal by comparing a first reference voltage with the control voltage, and to output a first clock signal by comparing a third reference voltage having a different voltage level from the first reference voltage with the control voltage. clock generator further includes a second clock output circuit configured to compare a second reference voltage with the control voltage, to compare a fourth reference voltage having a different voltage level from the second reference voltage with the control voltage, and to generate a second clock signal having a phase different from that of the first clock signal.

19 Claims, 7 Drawing Sheets

100

100

CLOCK GENERATOR AND VOLTAGE GENERATION CIRCUIT INCLUDING THE SAME

CROSS-REFERENCE TO RELATED APPLICATION

This patent document claims the priority under 35 U.S.C. § 119(a) to and benefits from Korean patent application No. 10-2023-0076773, filed on Jun. 15, 2023, in the Korean Intellectual Property Office, which is hereby incorporated by reference in its entirety as part of the disclosure of this patent document.

TECHNICAL FIELD

The technology and embodiments disclosed in this patent document generally relate to a clock generator and a voltage generation circuit including the same.

BACKGROUND

An image sensing device may use a voltage generation circuit to change a driving voltage thereof. The voltage generation circuit may serve as a circuit that generates a desired operation voltage by performing an operation on a supply voltage, and the operation voltage may be higher than the supply voltage.

The voltage generation circuit may be implemented in various ways according to embodiments, and may use a clock signal to generate a supply voltage serving as an operation voltage. For example, during a period in which the voltage generation circuit is activated, an operation voltage may be generated in response to a period of a clock signal having a constant width.

Here, the voltage generation circuit may be provided with a plurality of voltage generation circuits to generate different levels of operation voltages. However, when the plurality of voltage generation circuits is simultaneously activated by one clock signal having the same phase, the voltage generation circuits cannot accurately generate the operation voltage at a desired target level while simultaneously causing electromagnetic interference (EMI) issues.

SUMMARY

Various embodiments of the disclosed technology relate to a clock generator that generates multiple clock signals having different phases.

Various embodiments of the disclosed technology relate to a voltage generation circuit that generates an operation voltage by multiple clock signals having different phases.

In accordance with an embodiment of the disclosed technology, a clock generator may include: a voltage supply circuit configured to generate a control voltage based on a first current and a control signal; a first clock output circuit configured to output the control signal by comparing a first reference voltage with the control voltage, and to output a first clock signal by comparing a third reference voltage having a different voltage level from the first reference voltage with the control voltage; and a second clock output circuit configured to compare a second reference voltage with the control voltage, to compare a fourth reference voltage having a different voltage level from the second reference voltage with the control voltage, and to generate a second clock signal having a phase different from that of the first clock signal.

In accordance with another embodiment of the disclosed technology, a voltage generation circuit may include a clock generator configured to generate a plurality of clock signals having different phases and a plurality of charge pumps configured to generate a plurality of operation voltages by performing a pumping operation based on the plurality of clock signals. The clock generator includes a voltage supply circuit configured to perform charging of a first current, and thus generate a control voltage in which a voltage level increases during an activation period of a control signal. The clock generator also includes a plurality of clock output circuits configured to generate a plurality of comparison signals by comparing each of a plurality of reference voltages having different levels with the control voltage, and to output a plurality of clock signals having different phases based on the plurality of comparison signals.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology are readily apparent with reference to the following detailed description when considered in conjunction with the accompanying drawings.

DETAILED DESCRIPTION

Figure 1:
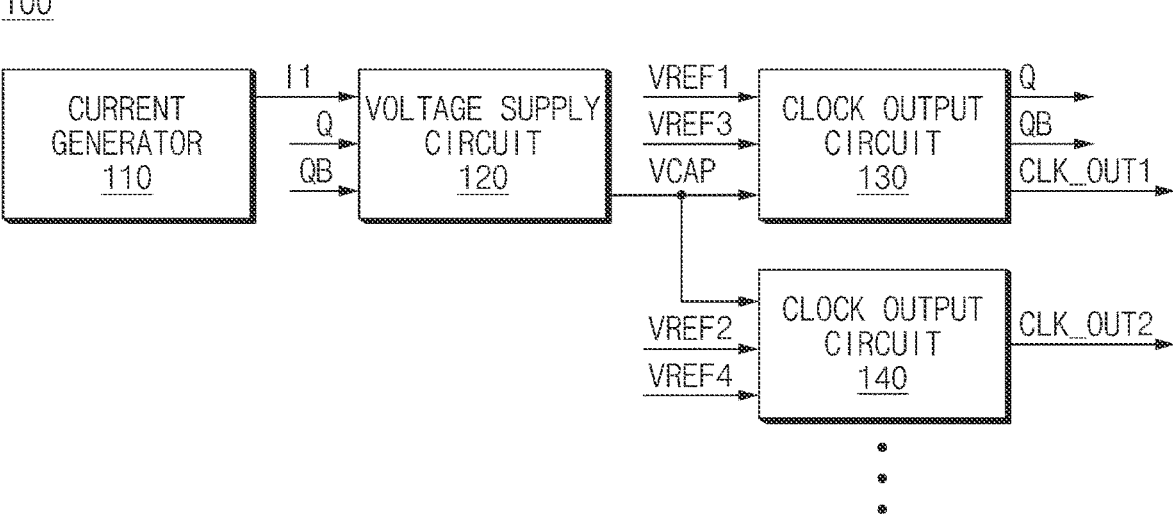
FIG. 1 is a block diagram illustrating an example of a clock generator based on some embodiments of the disclosed technology.

This patent document provides embodiments and examples of a clock generator and a voltage generation circuit including the same that may be used in configurations to substantially address one or more technical or engineering issues and to mitigate limitations or disadvantages encountered in some other clock generators in the art. Some embodiments of the disclosed technology relate to a clock generator that generates multiple clock signals having different phases. Some embodiments of the disclosed technology relate to a voltage generation circuit that generates an operation voltage by multiple clock signals having different phases. In recognition of the issues above, the clock generator and the voltage generation circuit including the same based on some embodiments of the disclosed technology can provide a plurality of voltage generation circuits with multiple clock signals having different phases to distribute operations of the voltage generation circuit, thereby stably generating an operation voltage.

Reference is made in detail to the embodiments of the disclosed technology, examples of which are illustrated in the accompanying drawings. Wherever possible, the same reference numbers are used throughout the drawings to refer to the same or like parts. While the disclosure is susceptible to various modifications and alternative forms, specific embodiments thereof are shown by way of example in the drawings. However, the disclosure should not be construed as being limited to the embodiments set forth herein.

Hereafter, various embodiments are described with reference to the accompanying drawings. However, it should be understood that the disclosed technology is not limited to specific embodiments, but includes various modifications, equivalents, and/or alternatives of the embodiments. The embodiments of the disclosed technology may provide a variety of effects capable of being directly or indirectly recognized through the disclosed technology.

FIG. 1 is a block diagram illustrating an example of a clock generator 100 based on some embodiments of the disclosed technology.

Referring to FIG. 1, the clock generator 100 may include a current generator 110, a voltage supply circuit 120, and a plurality of clock output circuits (130, 140).

In this case, the current generator 110 may generate a constant current (I1). In addition, the voltage supply circuit 120 may generate a control voltage VCAP based on the current (I1) and control signals (Q, QB).

The clock output circuit 130 may output the control signals (Q, QB) and a clock signal (CLK_OUT1) based on reference voltages (VREF1, VREF3) and the control voltage VCAP. For example, the clock output circuit 130 may output the control signals (Q, QB) and the clock signal (CLK_OUT1) by comparing the reference voltages (VREF1, VREF3) having different levels with the control voltage VCAP.

The clock output circuit 140 may output the clock signal (CLK_OUT2) based on reference voltages (VREF2, VREF4) and the control voltage (VCAP). For example, the clock output circuit 140 may output the clock signal (CLK_OUT2) by comparing the reference voltages (VREF2, VREF4) having different levels with the control voltage VCAP.

The clock signal (CLK_OUT1) output from the clock output circuit 130 may be a reference clock, and the clock generator 100 may generate clock signals (CLK_OUT2) having different phases based on the clock signal (CLK_OUT1).

In some embodiments, the reference voltages (VREF1~VREF4) input to the clock output circuits (130, 140) may have a voltage relationship denoted by "VREF1>VREF2>VREF3>VREF4". That is, among the reference voltages (VREF1~VREF4), the reference voltage VREF1 may have the highest voltage value, the reference voltage VREF2 may be lower than the reference voltage VREF1, and the reference voltage VREF3 may be lower than the reference voltage VREF2, and the reference voltage VREF4 may have a lower voltage level than the reference voltage VREF3.

For example, assuming that the clock signal (CLK_OUT1) has a duty cycle of 50%, the reference voltage VREF3 may have an intermediate value between the reference voltage VREF1 and zero volts (0V), as represented by 'VREF1=2×VREF3'. For example, assuming that the clock (CLK_OUT2) has a phase difference of 90 degrees with respect to the clock signal (CLK_OUT1), the reference voltage VREF2 may have an intermediate value between the reference voltage VREF1 and the reference voltage VREF3, as represented by 'VREF2=(VREF1−VREF3)/2', and the reference voltage VREF4 may have an intermediate value between the reference voltage VREF3 and zero volts (0V), as represented by 'VREF4=(VREF3−0V)/2'.

Although FIG. 1 shows two clock output circuits (130, 140) configured to respectively output two clock signals (CLK_OUT1, CLK_OUT2) for convenience of description, the clock generator 100 based on some embodiments of the disclosed technology is configured to generate multiple clock signals, and the number of the clock output circuits and the number of output clock signals are not limited thereto.

The following embodiment of the disclosed technology discloses an example in which the clock signal (CLK_OUT2) has a phase difference of 90 degrees with respect to the reference clock signal (CLK_OUT1). However, this is merely an example, and the phase difference between the multiple clock signals (CLK_OUT1, CLK_OUT2, . . . ) is not limited thereto.

Figure 2:
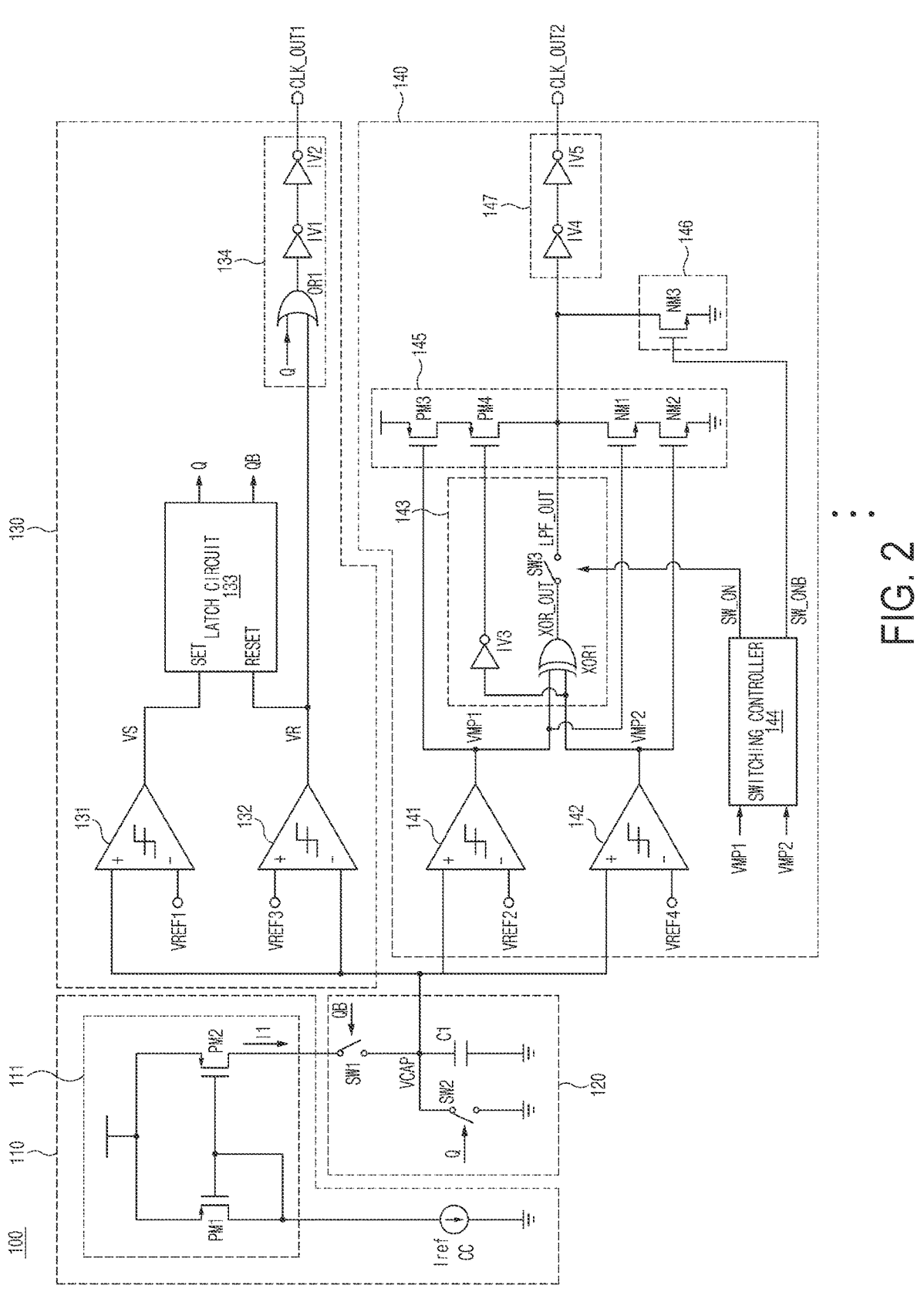
FIG. 2 is a detailed circuit diagram illustrating an example of the clock generator shown in FIG. 1 based on some embodiments of the disclosed technology.

FIG. 2 is a detailed circuit diagram illustrating an example of the clock generator 100 shown in FIG. 1 based on some embodiments of the disclosed technology.

Referring to FIG. 2, the current generator 110 may include a current mirror circuit 111 and a reference current source CC.

Here, the current mirror circuit 111 may perform mirroring of a reference current (Iref) generated by the reference current source CC, and may output a current (I1) having a predetermined level. In this case, the expression "mirroring" may refer to an operation for allowing a current copied from another current flowing in a specific node to flow in another node. That is, the current mirror circuit 111 may be mirrored in a manner that the same amount of current as those of the reference current (Iref) supplied from the reference current source CC can flow therein, resulting in formation of the current (I1).

The current mirror circuit 111 may include a plurality of transistors (PM1, PM2). Each of the transistors (PM1, PM2) may be implemented as a metal oxide semiconductor field effect transistor (MOSFET), and a representative example of such transistors may be implemented as a PMOS transistor. The transistor PM1 may be connected between the power-voltage terminal and the reference current source CC, so that a gate terminal and a drain terminal of the transistor PM1 may be connected in common. The transistor PM2 may be connected between the power-voltage terminal and the voltage supply circuit 120. Gate terminals of the plurality of transistors (PM1, PM2) may be connected in common to each other.

The reference current source CC may be connected between the transistor PM1 and a ground voltage terminal to generate the reference current (Iref). The reference current (Iref) may be implemented to have characteristics that are insensitive to a process, voltage, and temperature (PVT). The reference current (Iref) and the current (I1) to be mirrored by the current generator 110 may have similar characteristics. Therefore, because the reference current (Iref) is insensitive to the process, voltage, and temperature (PVT), the output current (I1) may also have characteristics that are insensitive to the process, voltage, and temperature (PVT).

In some embodiments, the current generator 110 may also use other various conventional reference voltage generators. For example, the current generator 110 may also be implemented as a bandgap reference voltage generator as needed.

Also, the voltage supply circuit 120 may include a plurality of switching elements (SW1, SW2) and a capacitor C1.

Here, the switching element SW1 may be connected between the transistor PM2 and the output terminal of the control voltage VCAP so that the switching operation thereof can be controlled by the control signal Q. The switching element SW2 may be connected between the output terminal of the control voltage VCAP and the ground voltage terminal so that the switching operation thereof can be controlled by the control signal QB.

The capacitor C1 may be connected between the output terminal of the control voltage VCAP and the ground voltage terminal to charge the current (I1) applied through a switching element SW1. When the switching element SW1 is turned on, the current (I1) is charged in the capacitor C1 so that the control voltage VCAP can be continuously increased by a charging voltage.

The control signal Q and the other control signal QB may have opposite phases, and the switching element SW1 and the switching element SW2 can operate complementarily to each other by the control signals (Q, QB). For example, when the switching element SW1 is turned on (or connected) by the control signal QB, the switching element SW2 may be turned off (or short-circuited) by the control signal Q. Conversely, when the switching element SW1 is turned off by the control signal QB, the switching element SW2 may be turned on by the control signal Q.

In addition, the clock output circuit 130 may include a plurality of comparators (131, 132), a latch circuit 133, and a combination circuit 134.

Here, the comparator 131 may compare the control voltage VCAP with the reference voltage VREF1, and may output a comparison signal VS corresponding to the result of comparison between the control voltage VCAP and the reference voltage VREF1. The comparator 131 may receive the control voltage VCAP through a non-inverting (+) input terminal thereof, may receive the reference voltage VREF1 through an inverting (−) input terminal thereof, and may output the comparison signal VS through an output terminal thereof.

The comparator 132 may compare the control voltage VCAP with the reference voltage VREF3, and may output a comparison signal VR corresponding to the result of comparison between the control voltage VCAP and the reference voltage VREF3. The comparator 132 may receive the reference voltage VREF3 through a non-inverting (+) input terminal thereof, may receive the control voltage VCAP through an inverting (−) input terminal thereof, and may output the comparison signal VR through an output terminal thereof.

The latch circuit 133 may latch the comparison signals (VS, VR) to output the control signals (Q, QB). The latch circuit 133 may receive the comparison signal VS through a set terminal (SET) thereof, and may receive the comparison signal VR through a reset terminal (RESET). Here, the latch circuit 133 may include an SR latch.

The combination circuit 134 may logically combine the control signal Q and the comparison signal VR to output the clock signal (CLK_OUT1). The combination circuit 134 may output the clock signal (CLK_OUT1) based on logic levels of the control signal Q and the comparison signal VR. Here, the combination circuit 134 may include an OR gate (OR1) and a plurality of inverters (IV1, IV2). The OR gate (OR1) may perform a logic OR operation on the control signal Q and the comparison signal VR. In addition, the plurality of inverters (IV1, IV2) may output the clock signal (CLK_OUT1) by performing non-inversion delaying of the output signal of the OR gate OR1.

In addition, the clock output circuit 140 may include a plurality of comparators (141, 142), a drive controller 143, a switching controller 144, a driver 145, a pull-down driver 146, and a delay circuit 147.

Here, the comparator 141 may compare the control voltage VCAP with the reference voltage VREF2, and may output a comparison signal VMP1 corresponding to the result of comparison between the control voltage VCAP and the reference voltage VREF2. The comparator 141 may receive the control voltage VCAP through a non-inverting (+) input terminal thereof, may receive the reference voltage VREF2 through an inverting (−) input terminal thereof, and may output a comparison signal VMP1 through an output terminal thereof.

The comparator 142 may compare the control voltage VCAP with the reference voltage VREF4, and may output a comparison signal VMP2 corresponding to the result of comparison between the control voltage VCAP and the reference voltage VREF4. The comparator 142 may receive the control voltage VCAP through a non-inverting (+) input terminal thereof, may receive the reference voltage VREF4 through an inverting (−) input terminal thereof, and may output the comparison signal VS through an output terminal thereof.

The drive controller 143 may generate a driving signal (XOR_OUT) based on the comparison signals (VMP1, VMP2), and may selectively control a filtering signal (LPF_OUT) corresponding to the driving signal (XOR_OUT) in response to the switching control signals (SW_ON, SW_ONB).

The drive controller 143 may include an XOR gate (XOR1) (serving as a logic combination element), an inverter IV3, and a switching element SW3. Here, the XOR gate (XOR1) may perform an XOR operation on the comparison signals (VMP1, VMP2) to output the driving signal (XOR_OUT). In addition, the switching operation of the switching element SW3 may be controlled in response to the switching control signal (SW_ON).

For example, when the switching control signal (SW_ON) is activated, the switching element SW3 may be turned on. That is, the connection terminal of the driving signal (XOR_OUT) and the connection terminal of the filtering signal (LPF_OUT) may be connected to each other. Then, the driving signal (XOR_OUT) may be output as the filtering signal LPF_OUT. On the other hand, when the switching control signal (SW_ON) is deactivated, the switching element SW3 may be turned off. That is, the connection terminal of the driving signal (XOR_OUT) and the connection terminal the filtering signal LPF_OUT may be short-circuited (blocked). As a result, the drive signal (XOR_OUT) might not be output as the filtering signal (LPF_OUT). The inverter IV3 may invert the comparison signal VMP2, and may thus output the resultant non-inversion comparison signal VMP2.

The switching controller 144 may control the switching control signals (SW_ON, SW_ONB) based on the comparison signals (VMP1, VMP2). The switching control signal (SW_ONB) output from the switching controller 144 may be provided to the pull-down driver 146.

Here, the switching control signal (SW_ONB) may have a phase opposite to that of the switching control signal (SW_ON). For example, when the switching control signal (SW_ON) is activated, the switching element SW3 is turned on and the switching control signal (SW_ONB) is deactivated, so that the pull-down driver 146 can be turned off. On the other hand, when the switching control signal (SW_ON) is deactivated, the switching element SW3 is turned off and the switching control signal SW_ONB is activated so that the pull-down driver 146 can be turned on.

In addition, the driver 145 may control the filtering signal (LPF_OUT) based on the comparison signals (VMP1, VMP2) and the output signal of the drive controller 143. The driver 145 may include a plurality of transistors (PM3, PM4, NM1, NM2). Here, each of the transistors (PM3, PM4) may be a PMOS transistor, and each of the transistors (NM1, NM2) may be an NMOS transistor. The plurality of transistors (PM3, PM4, NM1, NM2) may be connected in series between the power voltage terminal and the ground voltage terminal.

The transistor PM3 may receive a comparison signal VMP1 through a gate terminal thereof, and the transistor PM4 may receive an output signal of the inverter IV3 through a gate terminal thereof. The transistor NM1 may receive a comparison signal VMP1 through a gate terminal thereof, and the transistor NM2 may receive a comparison signal VMP2 through a gate terminal thereof. The transistors (PM4, NM1) may output the filtering signal (LPF_OUT) through a common drain terminal.

The pull-down driver 146 may pull-down drive the output node of the filtering signal (LPF_OUT) in response to the switching control signal (SW_ONB). The pull-down driver 146 may include a transistor NM3. The transistor NM3 may include an NMOS transistor. The transistor NM3 may be connected between the output terminal of the filtering signal (LPF_OUT) and the ground voltage terminal, and may receive the switching control signal (SW_ONB) through a gate terminal thereof.

For example, the transistor NM3 may be turned on when the switching control signal SW_ONB is at a high level, so that the output terminal of the filtering signal (LPF_OUT) can be pulled down to the ground voltage level. On the other hand, the transistor NM3 may be turned off when the switching control signal SW_ONB is at a low level.

The delay circuit 147 may output the clock signal CLK_OUT2 by non-inversion delaying the filtering signal (LPF_OUT). The delay circuit 147 may include a plurality of inverters (IV4, IV5).

The operation of the clock generator 100 having the above-described constituent elements is described in detail with reference to an operation timing diagram of FIG. 5 to be described later.

Figure 3:
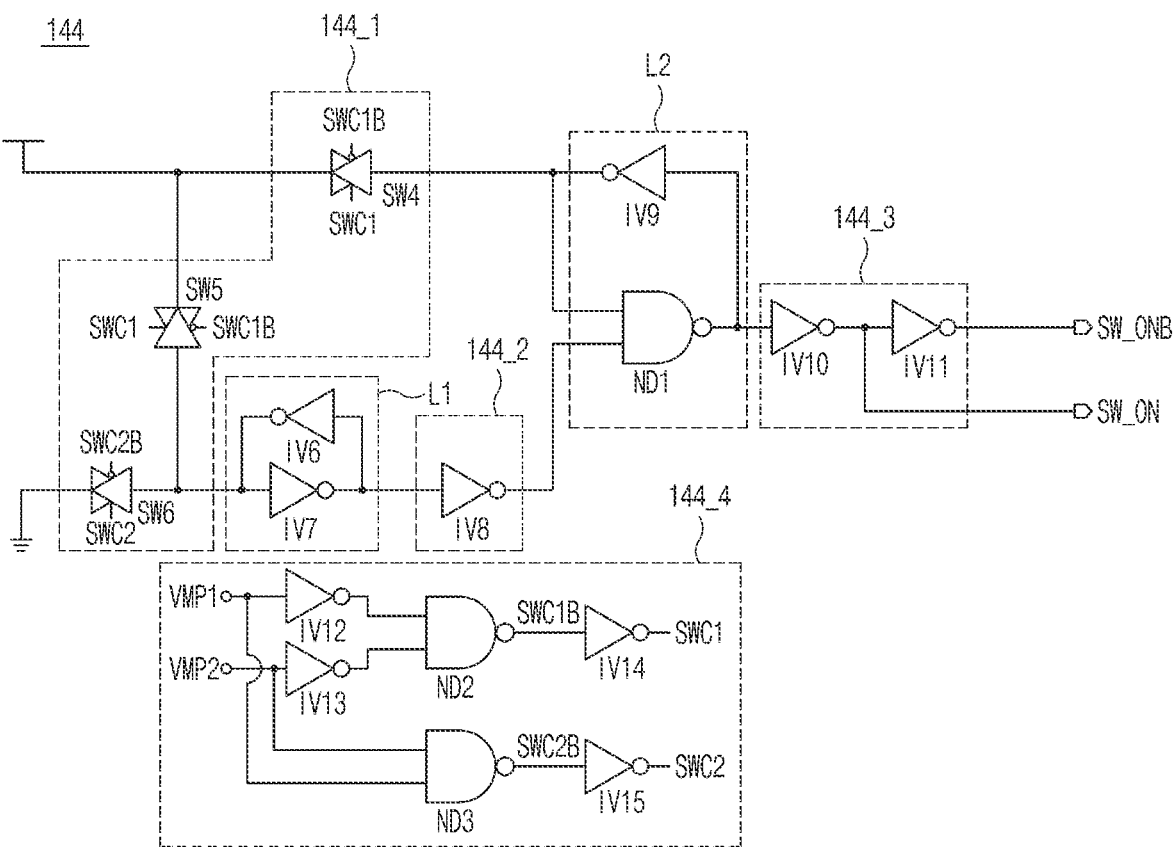
FIG. 3 is a detailed circuit diagram illustrating an example of the switching controller shown in FIG. 2 based on some embodiments of the disclosed technology.

FIG. 3 is a detailed circuit diagram illustrating an example of the switching controller 144 shown in FIG. 2 based on some embodiments of the disclosed technology.

Referring to FIG. 3, the switching controller 144 may include a voltage transfer circuit 144_1, latch circuits (L1, L2), an inversion circuit 144_2, a switching control signal output circuit 144_3, and a control signal generator 144_4.

The voltage transfer circuit 144_1 may selectively supply a power voltage and a ground voltage based on transfer control signals (SWC1, SWC1B, SWC2, SWC2B). The voltage transmitter 144_1 may include a plurality of switching elements SW4 to SW6. Here, each of the plurality of switching elements SW4 to SW6 may include a transfer gate. The transfer control signal SWC1B may have a phase opposite to that of the transfer control signal SWC1. In addition, the transfer control signal SWC2B may have a phase opposite to that of the transfer control signal SWC2.

The switching element SW4 may be connected between the power voltage terminal and the latch circuit L2, so that the switching element SW4 can selectively supply the power voltage based on the transfer control signals (SWC1, SWC1B). For example, the switching element SW4 may be turned on when the transfer control signal SWC1 is activated, so that the switching element SW4 can supply the power voltage to the latch circuit L2. On the other hand, the switching element SW4 may be turned off when the transfer control signal SWC1B is activated, so that the switching element SW4 can cut off the supply of the power voltage.

The switching element SW5 may be connected between the power voltage terminal and the latch circuit L1, so that the switching element SW5 can selectively connect the power voltage terminal to the input terminal of the latch circuit L1 based on the transfer control signals (SWC1, SWC1B). For example, the switching element SW5 may be turned on when the transfer control signal SWC1 is activated, so that the power voltage terminal and the input terminal of the latch circuit L1 can be connected to each other. On the other hand, the switching element SW5 may be turned off when the transfer control signal SWC1B is activated, so that the switching element SW5 can cut off the connection between the power voltage terminal and the input terminal of the latch circuit L1.

The switching element SW6 may be connected between the ground voltage terminal and the latch circuit L1, so that the switching element SW6 can selectively supply the ground voltage based on the transfer control signals (SWC2, SWC2B). For example, the switching element SW6 may be turned on when the transfer control signal SWC2 is activated, so that the switching element SW6 can supply the ground voltage to the latch circuit L1. On the other hand, the switching element SW6 may be turned off when the transfer control signal SWC2B is activated, so that the switching element SW6 can cut off the supply of the ground voltage.

The latch circuit L1 may latch the output signal of the switching element SW6. The latch circuit L1 may include inverters (IV6, IV7) having input and output (I/O) terminals connected to each other. The inversion circuit 144_2 may include an inverter IV8 for inverting the output signal of the latch circuit L1.

Also, the latch circuit L2 may latch the output signals of the switching element SW4 and the inversion circuit 144_2. The latch circuit L2 may include an inverter IV9 and a NAND gate ND1. The NAND gate ND1 may perform a NAND operation on the output signal of the inverter IV9 and the output signal of the inversion circuit 144_2.

The switching control signal output circuit 144_3 may output switching control signals (SW_ON, SW_ONB) based on the output signal of the latch circuit L2. The switching control signal output circuit 144_3 may include a plurality of inverters (IV10, IV11). The inverter IV10 may invert the output signal of the latch circuit L2 to output the switching control signal SW_ON. In addition, the inverter IV11 may invert the output signal of the inverter IV10 to output the switching control signal (SW_ONB).

The control signal generator 144_4 may generate transfer control signals (SWC1, SWC1B, SWC2, SWC2B) based on the comparison signals (VMP1, VMP2). The control signal generator 144_4 may include a plurality of inverters (IV12~IV15) and a plurality of NAND gates (ND2, ND3).

Here, the NAND gate ND2 may perform a NAND operation on the comparison signal VMP1 inverted by the inverter IV12 and the comparison signal VMP2 inverted by the inverter IV13 to generate the transfer control signal SWC1B. The inverter IV14 may generate the transfer control signal SWC1 by inverting the transfer control signal SWC2B. The NAND gate ND3 may generate the transfer control signal SWC2B by performing a NAND operation on the comparison signals (VMP1, VMP2). The inverter IV15 may generate the transfer control signal SWC2 by inverting the transfer control signal SWC2B.

Figure 4:
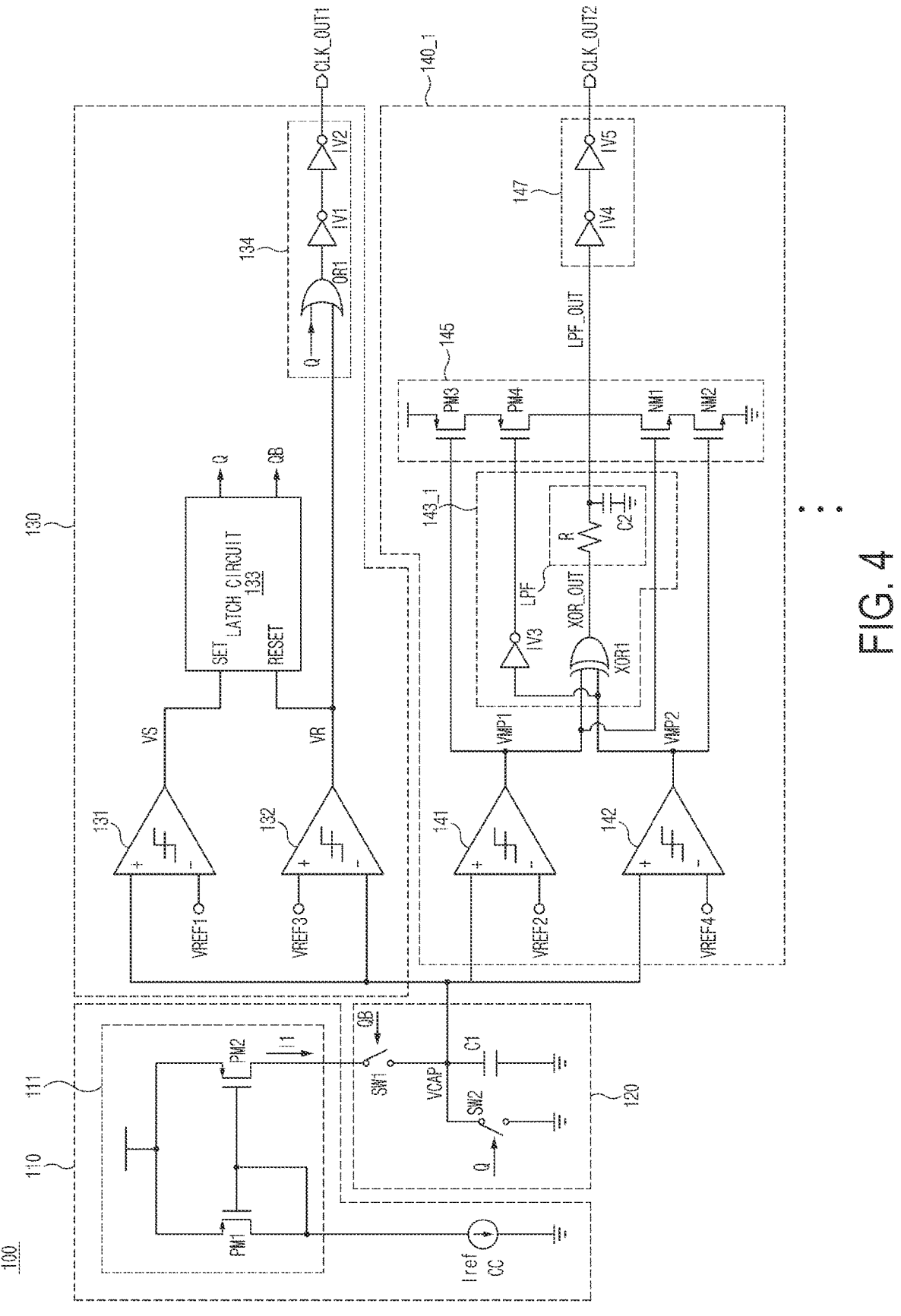
FIG. 4 is a detailed circuit diagram illustrating an example of the clock generator shown in FIG. 1 based on some other embodiments of the disclosed technology.

FIG. 4 is a detailed circuit diagram illustrating an example of the clock generator 100 shown in FIG. 1 based on some other embodiments of the disclosed technology.

Referring to FIG. 4, the constituent elements of the clock output circuit 140_1 may be different from those of the clock output circuit 140 shown in FIG. 2. Compared to the clock output circuit 140 of FIG. 2, the clock output circuit 140_1 of FIG. 4 might not include the switching controller 144 and the pull-down driver 146, and may include a drive controller 143_1 that is different in structure from the drive controller 143.

In the embodiment of FIG. 4, the remaining constituent elements other than the above-described differences and the connection relationship between the constituent elements are the same as those of FIG. 2, and as such redundant description thereof omitted herein for brevity.

The drive controller 143_1 may include an XOR gate (XOR1), an inverter IV3, and a filter circuit LPF. Here, to block the clock noise, the filter circuit LPF may output the filtering signal (LPF_OUT) by filtering the driving signal (XOR_OUT).

The filter circuit LPF may include a resistor R and a capacitor C2. The resistor R may be connected between the driving signal (XOR_OUT) input terminal and the filtering signal (LPF_OUT) output terminal. Also, the capacitor C2 may be connected between the resistor R and the ground voltage terminal.

The filter circuit LPF may perform low-pass filtering on the driving signal (XOR_OUT) using the resistor R and the capacitor C2 configured to have a resistor-capacitor (RC) time constant, and may thus output a filtering signal (LPF_OUT) from which high-frequency noise was removed.

Figure 5:
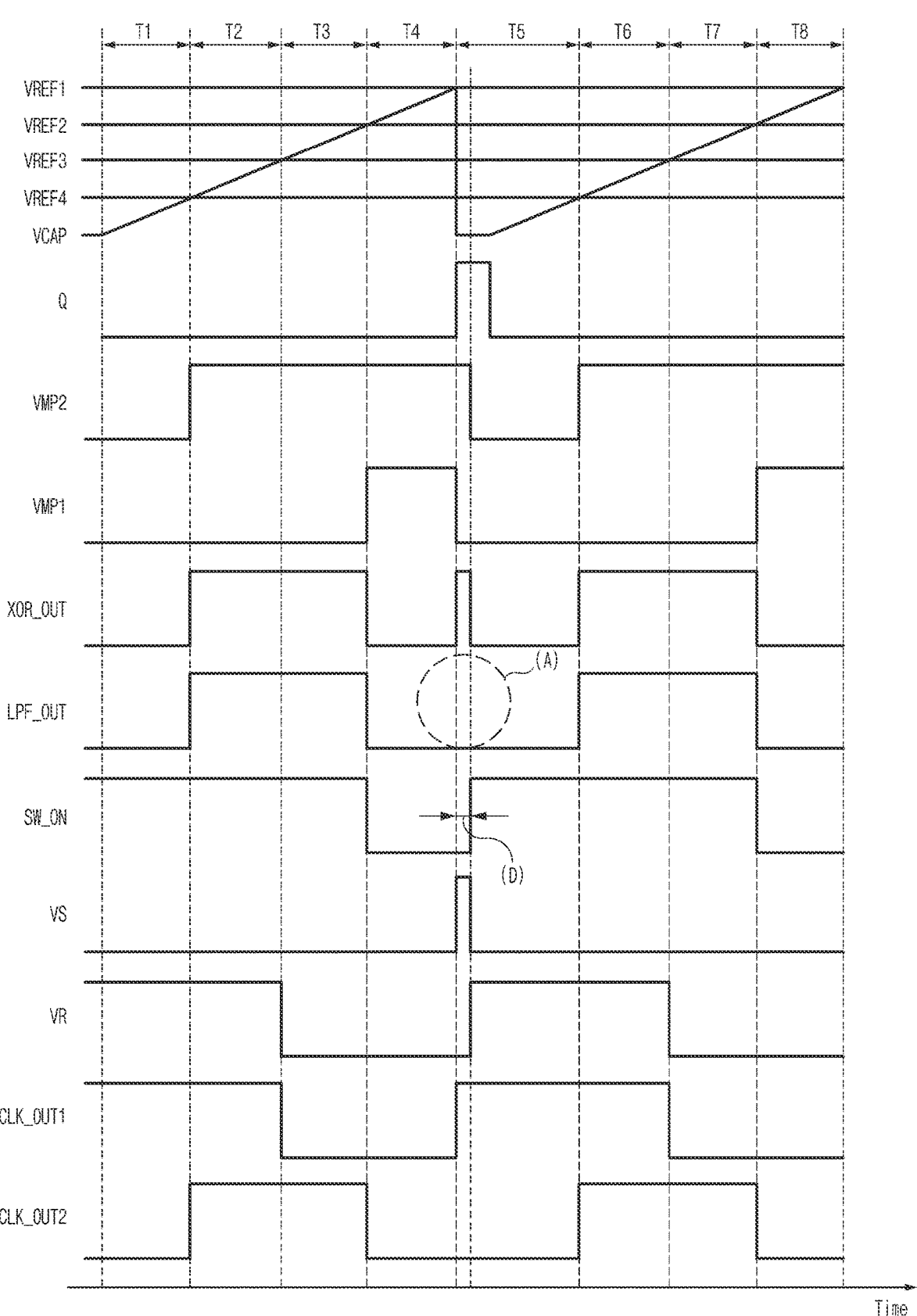
FIG. 5 is a timing diagram illustrating an example of operations of the clock generator based on some embodiments of the disclosed technology.

FIG. 5 is a timing diagram illustrating an example of operations of the clock generator 100 based on some embodiments of the disclosed technology.

Referring to FIG. 5, during a time period T1, the control voltage VCAP may be lower than the reference voltage VREF4.

Therefore, the comparators (131, 141, 142) of the clock output circuit 130 may output all of the comparison signals (VS, VMP1, VMP2) at low levels by the comparison operation. In more detail, the comparator 131 of the clock output circuit 130 may output the comparison signal VS at a low level by the comparison operation, the comparator 141 of the clock output circuit 130 may output the comparison signal VMP1 at a low level by the comparison operation, and the comparator 142 of the clock output circuit 130 may output the comparison signal VMP2 at a low level by the comparison operation. However, the input terminal of the comparator 132 may correspond to an inversion state of the input terminals of the comparators (131, 141, 142). As a result, when the control voltage VCAP is lower than the reference voltage VREF3, the comparison signal VR can maintain a high level by the comparison operation of the comparator 132.

Accordingly, the latch circuit 133 may receive the low-level comparison signal VS through a set terminal (SET) thereof, and may receive the high-level comparison signal VR through a reset terminal (RESET) thereof, so that the control signal Q can be output at a low level and the other control signal QB can be output at a high level. When the low-level control signal Q and the high-level comparison signal VR are applied to the OR gate (OR1) of the combination circuit 134, the clock signal (CLK_OUT1) may be output at a high level.

In this case, the frequency of a desired clock signal (CLK_OUT1) can be represented by Equation 1 below.

$$F = I/(C \times V) \qquad \text{[Equation 1]}$$

In Equation 1, 'F' may denote the frequency of the clock signal (CLK_OUT1), 'I' may denote the current (I1), 'V' may denote the reference voltage (VREF1), and 'C' may denote capacitance of the capacitor C1. The frequency of the clock signal (CLK_OUT1) can be obtained by dividing the value of the current (I1) by a value obtained by multiplying the capacitance value of the capacitor C1 by the reference voltage VREF1.

When the control signal Q is at a low level and the control signal QB is at a high level, the switching element SW1 of the voltage supply circuit 120 may be turned on and the switching element SW2 may be turned off. When the switching element SW1 is turned on, the capacitor C1 is charged with capacitance in response to the current (I1) received from the current generator 110, so that the voltage level of the control voltage VCAP may gradually increase from the ground voltage level.

When the comparison signals (VMP1, VMP2) are at a low level, the drive signal (XOR_OUT), which is an output signal of the XOR gate (XOR1) of the drive controller 143, may be at a low level. In addition, when the comparison signals (VMP1, VMP2) are at a low level, the transfer control signal SWC1 can be output at a high level and the transfer control signal SWC2 can be output at a low level by a logic combination of the control signal generator 144_4.

Then, the switching elements (SW4, SW5) of the voltage transfer circuit 144_1 may be turned on and the switching element SW6 may be turned off.

Accordingly, the switching controller 144 may latch the high-level signal through the latch circuits (L1, L2), may output the switching control signal (SW_ON) at a high level through the switching control signal output circuit 144_3, and may output the switching control signal (SW_ONB) at a low level through the switching control signal output circuit 144_3.

When the switching control signal (SW_ON) is output at a high level, the switching element SW3 of the drive controller 143 is turned on and the filtering signal (LPF_OUT) is output at a low level. Here, when the switching control signal (SW_ONB) is at a low level, the pull-down driver 146 may maintain a turned-off state.

When the comparison signals (VMP1, VMP2) are at a low level, the transistor PM3 of the driver 145 is turned on, but the transistors (PM4, NM1, NM2) are turned off so that the driver 145 does not operate. Accordingly, the clock output circuit 140_1 may control the logic level of the filtering signal (LPF_OUT) in response to the driving signal (XOR_OUT). When the filtering signal (LPF_OUT) is at a low level, the clock signal (CLK_OUT2) may be output at a low level through the delay circuit 147.

Thereafter, in a time period T2, when the capacitor C1 is continuously charged by the current (I1), the control voltage VCAP may become higher than the reference voltage VREF4. Then, the comparison signal VMP2 may transition to a high level through the comparison operation of the comparator 142. When the comparison signal VMP2 is at a high level, the driving signal (XOR_OUT), which is the output signal of the XOR gate (XOR1), may transition to a high level.

When the switching control signal (SW_ON) is at a high level, the switching element SW3 is turned on, so that the filtering signal (LPF_OUT) may transition to a high level according to the logic level of the driving signal (XOR_OUT). Here, when the comparison signal VMP1 is at a low level and the other comparison signal VMP2 transitions to a high level, the transistors (PM3, PM4) of the driver 145 may be turned on. Accordingly, the output node of the filtering signal (LPF_OUT) can be rapidly pulled up to a high level.

When the filtering signal (LPF_OUT) is at a high level, the clock signal (CLK_OUT2) may transition to a high level through the delay circuit 147. Also, because the clock signal (CLK_OUT1) remains at a high level while the comparison signal VR is at a high level, the clock signal (CLK_OUT2) may have a phase difference of 90 degrees with respect to the clock signal (CLK_OUT2).

Subsequently, in a time period T3, when the capacitor C1 is continuously charged by the current (I1), the control voltage VCAP may become higher than the reference voltage VREF3. Then, the comparison signal VR may transition to a low level through the comparison operation of the comparator 132. The latch circuit 133 may maintain the level of the control signal Q during a delay time when both of the comparison signals (VS, VR) are at a low level. When the low-level control signal Q and the low-level comparison signal VR are applied to the OR gate (OR1) of the combination circuit 134, the clock signal (CLK_OUT1) may transition to a low level.

Here, because the switching control signal (SW_ON) maintains a high level, the switching element SW3 can maintain a turned-on state. In addition, when the comparison signal VMP1 remains at a low level and the comparison signal VMP2 remains at a high level, the transistors (PM3, PM4) of the driver 145 may maintain a turned-on state. Accordingly, the output node of the filtering signal (LPF_OUT) can be pulled up by the driver 145 even in the time period T3. Also, the clock signal (CLK_OUT2) may be maintained at a high level by the filtering signal (LPF_OUT).

Subsequently, in a time period T4, when the capacitor C1 is continuously charged by the current (I1), the control voltage VCAP may become higher than the reference voltage VREF2. Then, the comparison signal VMP1 may transition to a high level through the comparison operation of the comparator 141. When the comparison signal VMP1 is at a high level, the driving signal (XOR_OUT), which is the output signal of the XOR gate (XOR1), may transition to a low level again.

When both of the comparison signals (VMP1, VMP2) are at a high level, the drive signal (XOR_OUT), which is the output signal of the XOR gate (XOR1) of the drive controller 143, may be at a low level. In addition, when both of comparison signals (VMP1, VMP2) are at a high level, the transfer control signal SWC1 can be output at a low level and the transfer control signal SWC2 can be output at a high level by a logic combination of the control signal generator 144_4.

Then, the switching elements (SW4, SW5) of the voltage transfer circuit 144_1 may be turned off, and the switching element SW6 of the voltage transfer circuit 144_1 may be turned on. Accordingly, the switching controller 144 may latch the low-level signal through the latch circuits (L1, L2), may output the switching control signal (SW_ON) at a low level through the switching control signal output circuit 144_3, and may output the switching control signal (SW_ONB) at a high level.

When the switching control signal SW_ON is at a low level, the switching element SW3 may be turned off. Also, when both of the comparison signals (VMP1, VMP2) are at a high level, the transistors (NM1, NM2) of the driver 145 are turned on, so that the filtering signal (LPF_OUT) can be rapidly pulled down to a low level. Here, when the switching control signal (SW_ON) is at a low level and the switching control signal (SW_ONB) is at a high level, the pull-down driver 146 is turned on, so that the filtering signal (LPF_OUT) can be pulled down to a low level.

When the filtering signal (LPF_OUT) is at a low level, the clock signal (CLK_OUT2) may transition to a low level through the delay circuit 147. Because both the control signal Q and the comparison signal VR remain at a low level, the clock signal (CLK_OUT1) can also maintain a low level.

Thereafter, in a time period T5, when the control voltage VCAP becomes higher than the reference voltage VREF1 (when the control voltage VCAP reaches the reference voltage (VREF1) level), the comparison signal VS may transition to a high level through the comparison operation of the comparator 131. The control voltage VCAP may have a curve that has a slope gradually rising until reaching the reference voltage (VREF1) level and then rapidly drops to the ground voltage level after the control voltage VCAP reaches the reference voltage (VREF1) level.

When the comparison signal VS is at a high level, the latch circuit 133 may output the control signal Q at a high level during a predetermined delay time. When the high-level control signal Q and the low-level comparison signal VR are applied to the OR gate (OR1) of the combination circuit 134, the clock signal (CLK_OUT1) may transition to a high level.

In addition, when the control signal Q is at a high level and the control signal QB is at a low level, the switching element SW1 of the voltage supply circuit 120 may be turned off and the switching element SW2 may be turned on. When the switching element SW1 is turned off, the current (I1) from the current generator 110 might not be transferred to the capacitor C1. When the switching element SW2 is turned on, the capacitance charged in the capacitor C1 is discharged through the ground voltage terminal, so that the voltage level of the control voltage VCAP can be initialized to the ground voltage level.

When the control voltage VCAP is initialized to the ground voltage level and the comparison signal VS transitions to a low level, the comparison signal VR may transition to a high level again. When the comparison signal VR is at a low level and the comparison signal VS is at a high level, the clock signal (CLK_OUT1) may be output at a high level by the high-level control signal Q.

When the control voltage VCAP becomes lower than the reference voltage VREF2, the comparison signal VMP1 may transition to a low level by the comparator 141. Also, when the control voltage VCAP is lower than the reference voltage VREF4, the comparison signal VMP2 may transition to a low level by the comparator 142. When the control voltage VCAP becomes lower than the reference voltage VREF4 while the control signal Q transitions to a high level, both of the comparison signals (VMP1, VMP2) may transition to a low level.

Here, the comparison signal VMP1 may first transition to a low level, and the other comparison signal VMP2 may then transition to a low level after lapse of a predetermined delay time (D). In other words, due to a difference in input voltage between the comparator 141 and the other comparator 142, the offset voltage values of the comparators (141, 142), and parasitic components caused by the layout of the comparators (141, 142), the comparison signals VMP1 and VMP2 may transition to a low level at intervals of a predetermined time instead of simultaneously transitioning to a low level.

In this case, the driving signal (XOR_OUT), which is the output signal of the XOR gate (XOR1), may generate a pulse that transitions to a high level for a predetermined delay time. That is, due to a difference in delay time between the comparison signal VMP1 and the other signal VMP2, the driving signal (XOR_OUT) can generate a pulse that instantaneously transitions to a high level.

When the switching control signal (SW_ON) transitions to a high level at the time at which the comparison signal VMP1 transitions to a low level, the switching element SW3 is turned on, so that the driving signal (XOR_OUT) can be transferred as the filtering signal (LPF_OUT) without change. Accordingly, because the filtering signal (LPF_OUT) is generated as a pulse including noise, the clock signal (CLK_OUT2) may also transition to an abnormally high level.

However, in a state in which the switching signal (SW_ON) has already transitioned to a low level in the above-described period T4, the switching element SW3 may maintain a turned-off state. In addition, the switching control signal (SW_ON) may maintain a low level for a predetermined delay time (D) after entering the period T5. Then, the switching control signal (SW_ONB) becomes a high level during the predetermined delay time (D), so that the pull-down driver 146 may be turned on. Accordingly, the filtering signal (LPF_OUT) may maintain a low level for the predetermined delay time (D).

That is, the filtering signal (LPF_OUT) may transition to a high level in response to the driving signal (XOR_OUT) when the time period T5 is started. However, the switching element SW3 may be turned off by the switching control signal (SW_ON) and the output terminal of the filtering signal (LPF_OUT) may be pulled down by the switching control signal (SW_ONB), so that the filtering signal (LPF_OUT) can be output at a low level as shown in (A) of FIG. 5. Accordingly, the clock signal (CLK_OUT2) finally output from the clock output circuit 140 may maintain a stable low level without including unnecessary noise pulses in the time period T5.

When the control signal Q transitions back to the low level after lapse of the delay time of the latch circuit 133, the switching element SW1 of the voltage supply circuit 120 may be turned on again and the switching element SW2 may be turned off again. Then, the voltage level of the control voltage VCAP may increase again.

After that, the operations of the periods T6 to T8 are the same as those of the periods T2 to T4 described above, and as such redundant description of the periods T6 to T8 are omitted herein for brevity.

Figure 6:
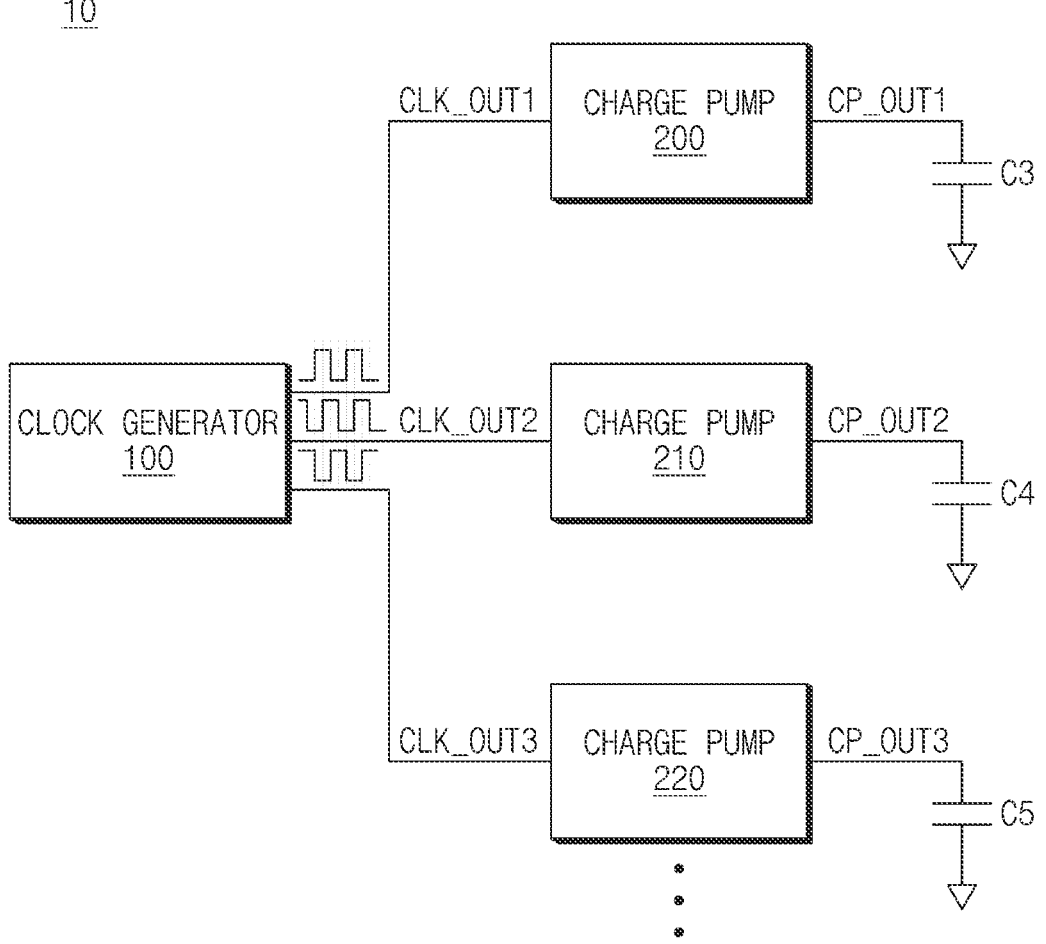
FIG. 6 is a schematic diagram illustrating an example of a voltage generation circuit including a clock generator based on some other embodiments of the disclosed technology.

FIG. 6 is a schematic diagram illustrating an example of a voltage generation circuit 10 including a clock generator 100 based on some other embodiments of the disclosed technology.

Referring to FIG. 6, the voltage generation circuit 10 may include a clock generator 100 and a plurality of charge pumps 200 to 220.

In this case, the plurality of charge pumps (200~220) may receive different clock signals (CLK_OUT1~CLK_OUT3) having different phases from the clock generator 100, may perform pumping on the received signals, and may thus generate operation voltages (CP_OUT1~CP_OUT3). In more detail, the charge pump 200 may receive the clock signal CLK_OUT1 from the clock generator 100, may perform pumping on the received signal, and may thus generate the operation voltage (CP_OUT1). The charge pump 210 may receive the clock signal CLK_OUT2 from the clock generator 100, may perform pumping on the received signal, and may thus generate the operation voltage (CP_OUT2). The charge pump 220 may receive the clock signal CLK_OUT3 from the clock generator 100, may perform pumping on the received signal, and may thus generate the operation voltage (CP_OUT3). For example, each of the plurality of charge pumps 200 to 220 may include a switching element (not shown) disposed between the charge source and the output terminal, so that the charge pumps 200 to 220 can connect or disconnect the charge source to or from the output terminal in response to a 'high' or 'low' level of the clock signals (CLK_OUT1~CLK_OUT3), thereby outputting charges. That is, the plurality of charge pumps (200~220) may control the output charge amount, an output speed, etc. according to the periods of the clock signals (CLK_OUT1~CLK_OUT3) or the duty cycle. In more detail, the charge pump 200 may control the output charge amount, the output speed, etc. according to the period of the clock signal (CLK_OUT1) or the duty cycle, the charge pump 210 may control the output charge amount, the output speed, etc. according to the period of the clock signal (CLK_OUT2) or the duty cycle, and the charge pump 220 may control the output charge amount, the output speed, etc. according to the period of the clock signal (CLK_OUT3) or the duty cycle. In some embodiments, the charge pump 30 may include a DCDC charge pump. In addition, the capacitors (C3~C5) may temporarily charge the operation voltages (CP_OUT1~CP_OUT3) generated by the plurality of charge pumps (200~220). In more detail, the capacitor C3 may temporarily charge the operation voltage (CP_OUT1) generated by the charge pump 200, the capacitor C4 may temporarily charge the operation voltage (CP_OUT2) generated by the charge pump 210, and the capacitor C5 may temporarily charge the operation voltage (CP_OUT3) generated by the charge pump 220.

In the embodiment of FIG. 6, the clock generator 100 may correspond to the clock generator 100 shown in FIGS. 1 to 4 described above, and as such a detailed description of the clock generator 100 are omitted herein for brevity.

In the embodiment of FIG. 6, the plurality of charge pumps 200 to 220 may operate by multiple clock signals (CLK_OUT1~CLK_OUT3) having different phases, rather than performing the pumping operation by only one clock. Therefore, the operation timing points of the plurality of charge pumps 200 to 220 are dispersed so that the operation voltages of the charge pumps 200 to 220 can be stably generated.

Figure 7:
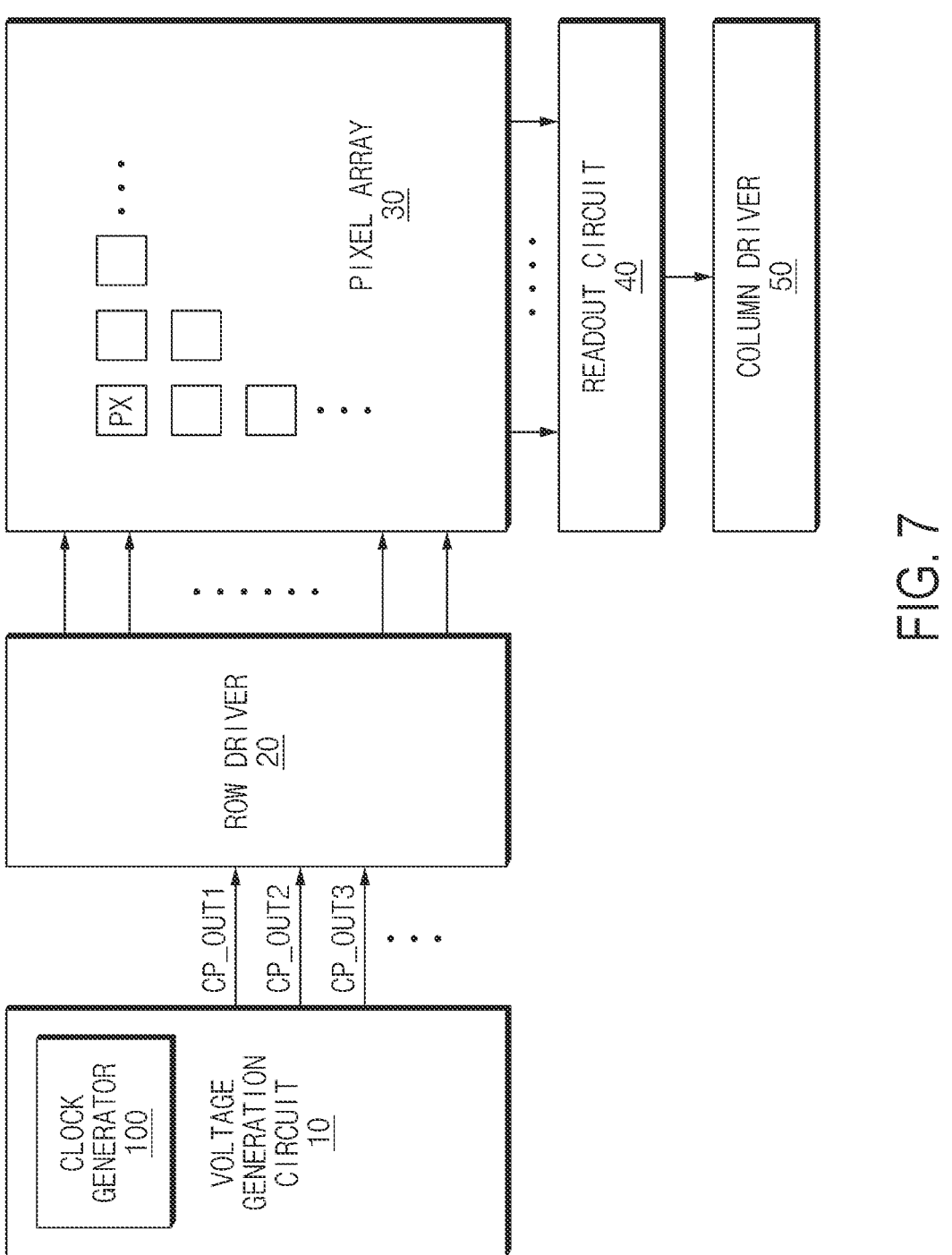
FIG. 7 is a block diagram illustrating an example of an image sensing device including a voltage generation circuit based on still other embodiments of the disclosed technology.

FIG. 7 is a schematic diagram illustrating an example of an image sensing device including a voltage generation circuit based on still other embodiments of the disclosed technology.

Referring to FIG. 7, the image sensing device based on some embodiments of the disclosed technology may include a voltage generation circuit 10, a row driver 20, a pixel array 30, a readout circuit 40, and a column driver 50.

The voltage generation circuit 10 may generate operation voltages (CP_OUT1~CP_OUT3) and provide the operation voltages (CP_OUT1~CP_OUT3) to the row driver 20. For example, the voltage generation circuit 10 may generate pumping voltages (VPP, VPP2, VPP3) each having a higher level than the reference voltage (e.g., the power voltage), and may further generate a back-bias voltage VBB having a lower level than the reference voltage (e.g., the ground voltage).

As such, the operation voltages (CP_OUT1~CP_OUT3) generated by the voltage generation circuit 10 may affect the operation of the pixel array 30. Accordingly, to stably control the operation voltages (CP_OUT1~CP_OUT3) generated by the voltage generation circuit 10, the clock generator 100 capable of generating multiple clock signals (CLK_OUT1~CLK_OUT3) without including noise is essential.

Accordingly, the voltage generation circuit 10 may use the voltage generation circuit 10 including the clock generator 100 described in FIGS. 1 to 6 described above. The operation voltages (CP_OUT1~CP_OUT3) required by the row driver 20 can be accurately generated through the voltage generation circuit 10.

The row driver 20 may drive the pixel array 30 on a row line basis. For example, the row driver 20 may generate a transfer control signal for controlling a transfer transistor of a pixel circuit, a reset control signal for controlling a reset transistor, or a selection control signal for controlling a selection transistor.

The pixel array 30 may generate a pixel signal in response to a control signal generated by the row driver 20. The pixel array 30 may include a plurality of pixels (PXs) disposed in an array shape along a plurality of row lines and a plurality of column lines.

Each of the pixels (PXs) may include a photoelectric conversion element that generates charges in response to incident light, for example, a photodiode, a phototransistor, a pinned photodiode, or the like. Each of the pixels (PXs) may include a pixel circuit for generating a pixel signal. The pixel circuit may include a transfer transistor, a drive (source-follower) transistor, a selection transistor, and a reset transistor.

The readout circuit 40 may convert a pixel signal generated by the pixel array 30 into a digital signal and output the digital signal. The readout circuit 40 may include a sampling circuit and an analog-to-digital converter (ADC).

The column driver 50 may include a latch or buffer capable of temporarily storing a digital signal. The column driver 50 may output image data by processing the digital signal received from the readout circuit 40.

As is apparent from the above description, the clock generator and the voltage generation circuit including the same based on some embodiments of the disclosed technology may provide the plurality of voltage generation circuits with multiple clock signals having different phases to distribute operations of the voltage generation circuit, thereby stably generating an operation voltage.

The embodiments of the disclosed technology may provide a variety of effects capable of being directly or indirectly recognized through the above-mentioned patent document.

Although a number of illustrative embodiments have been described, it should be understood that modifications and enhancements to the disclosed embodiments and other embodiments can be devised based on what is described and/or illustrated in this patent document.

What is claimed is:

1. A clock generator comprising:
a voltage supply circuit configured to generate a control voltage based on a first current and a control signal;

a first clock output circuit configured to output the control signal by comparing a first reference voltage with the control voltage, and to output a first clock signal by comparing a third reference voltage having a different voltage level from the first reference voltage with the control voltage; and a second clock output circuit configured to compare a second reference voltage with the control voltage, to compare a fourth reference voltage having a different voltage level from the second reference voltage with the control voltage, and to generate a second clock signal having a phase different from that of the first clock signal.

2. The clock generator according to claim 1, wherein:

the second reference voltage is set to have a lower level than the first reference voltage, the third reference voltage is set to have a lower level than the second reference voltage, and the fourth reference voltage is set to have a lower level than the third reference voltage.

3. The clock generator according to claim 1, further comprising a current generator configured to generate the first current, wherein the current generator includes:

a reference current source configured to generate a reference current; and a current mirror circuit configured to generate the first current by mirroring the reference current.

4. The clock generator according to claim 3, wherein the current mirror circuit includes:

a first transistor connected between a power voltage terminal and the reference current source, the first transistor configured to have a gate terminal and a drain terminal that are commonly connected to each other; and a second transistor connected between the power voltage terminal and the reference current source, the second transistor configured to have a gate terminal that is commonly connected to the gate terminal of the first transistor.

5. The clock generator according to claim 4, wherein:

the reference current source is connected between the first transistor and a ground voltage terminal.

6. The clock generator according to claim 1, wherein the voltage supply circuit includes:

a first switching element connected between an input terminal of the first current and an output terminal of the control voltage, the first switching element controlled by the control signal of the control signal;

a second switching element connected between an output terminal of the control voltage and a ground voltage terminal, the second switching element controlled by an inversion signal; and a first capacitor connected between the output terminal of the control voltage and the ground voltage terminal.

7. The clock generator according to claim 6, wherein the voltage supply circuit is configured such that:

when the first switching element is turned on by deactivation of the control signal, the first capacitor is charged according to the first current so that a level of the control voltage increases; and the second switching element is turned on by activation of the control signal so that the control voltage is discharged.

8. The clock generator according to claim 1, wherein the first clock output circuit includes:

a first comparator configured to output a first comparison signal by comparing the control voltage with the first reference voltage;

a second comparator configured to output a second comparison signal by comparing the control voltage with the third reference voltage;

a first latch circuit configured to output the control signal by latching the first comparison signal and the second comparison signal; and a combination circuit configured to output the first clock signal by logically combining the control signal with the second comparison signal.

9. The clock generator according to claim 8, wherein the second clock output circuit includes:

a third comparator configured to output a third comparison signal by comparing the control voltage with the second reference voltage;

a fourth comparator configured to output a fourth comparison signal by comparing the control voltage with the fourth reference voltage;

a switching controller configured to generate a switching control signal based on the third comparison signal and the fourth comparison signal;

a drive controller configured to generate a driving signal based on the third comparison signal and the fourth comparison signal, and to selectively control a filtering signal corresponding to the driving signal based on the switching control signal;

a driver configured to control the filtering signal based on the third comparison signal, the fourth comparison signal, and an output signal of the drive controller;

a pull-down driver configured to pull-down drive an output terminal of the filtering signal in response to an inversion signal of the switching control signal; and a delay circuit configured to output the second clock signal by delaying the filtering signal.

10. The clock generator according to claim 9, wherein the drive controller includes:

a logic combination element configured to generate the driving signal by logically combining the third comparison signal with the fourth comparison signal; and a third switching element configured to selectively output the driving signal as the filtering signal based on the switching control signal.

11. The clock generator according to claim 9, wherein the second clock output circuit is configured such that:

during a period in which the control voltage is lower than the fourth reference voltage and the first comparison signal is activated, when the third switching signal is turned off by deactivation of the switching control signal, a connection terminal between the driving signal and the filtering signal is cut off; and when the pull-down driver is turned on by activation of an inversion signal of the switching control signal, the filtering signal is pull-down driven.

12. The clock generator according to claim 9, wherein the driver includes:

a third transistor and a fourth transistor connected in series between a power voltage terminal and an output terminal of the filtering signal; and a fifth transistor and a sixth transistor connected in series between an output terminal of the filtering signal and a ground voltage terminal, wherein each of the third transistor and the fifth transistor is configured to receive the third comparison signal through a gate terminal thereof;

the fourth transistor is configured to receive an inversion signal of the fourth comparison signal through a gate terminal thereof; and the sixth transistor is configured to receive the fourth comparison signal through a gate terminal thereof.

13. The clock generator according to claim 9, wherein the switching controller includes:

a voltage transfer circuit configured to selectively supply a power voltage and a ground voltage based on a transfer control signal;

a second latch circuit configured to latch an output signal of the voltage transfer circuit;

a switching control signal output circuit configured to output the switching control signal based on an output signal of the second latch circuit; and a control signal generator configured to generate the transfer control signal by logically combining the third comparison signal with the fourth comparison signal.

14. The clock generator according to claim 1, wherein the second clock output circuit includes:

a third comparator configured to output a third comparison signal by comparing the control voltage with the second reference voltage;

a fourth comparator configured to output a fourth comparison signal by comparing the control voltage with the fourth reference voltage;

a drive controller configured to generate a driving signal based on the third comparison signal and the fourth comparison signal, and to output a filtering signal by delaying the driving signal;

a driver configured to control the filtering signal based on the third comparison signal, the fourth comparison signal, and an output signal of the drive controller; and a delay circuit configured to output the second clock signal by delaying the filtering signal.

15. The clock generator according to claim 14, wherein the drive controller includes:

a logic combination element configured to generate the driving signal by logically combining the third comparison signal with the fourth comparison signal; and a filter circuit configured to output the filtering signal by filtering the driving signal.

16. A voltage generation circuit comprising:

a clock generator configured to generate a plurality of clock signals having different phases; and a plurality of charge pumps configured to generate a plurality of operation voltages by performing a pumping operation based on the plurality of clock signals;

wherein the clock generator includes:

a voltage supply circuit configured to perform charging of a first current, and to generate a control voltage in which a voltage level increases during an activation period of a control signal;

a first clock output circuit configured to output the control signal by comparing a first reference voltage with the control voltage, and to output a first clock signal by comparing a third reference voltage having a different voltage level from the first reference voltage with the control voltage; and a second clock output circuit configured to compare a second reference voltage with the control voltage, to compare a fourth reference voltage having a different voltage level from the second reference voltage with the control voltage, and to generate a second clock signal having a phase different from that of the first clock signal.

17. The voltage generation circuit according to claim 16, wherein the voltage supply circuit includes:

a first switching element and a second switching element configured to be complementarily switched by the control signal and an inversion signal of the control signal; and a capacitor configured to be charged with the first current, wherein when the first switching element is turned on by activation of the control signal, the capacitor is charged according to the first current so that a level of the control voltage increases; and the second switching element is turned on by activation of the control signal so that the control voltage is discharged.

18. The voltage generation circuit according to claim 16, wherein the first clock output circuit includes:

a first comparator configured to output a first comparison signal by comparing the control voltage with the first reference voltage;

a second comparator configured to output a second comparison signal by comparing the control voltage with the third reference voltage;

a first latch circuit configured to output the control signal by latching the first comparison signal and the second comparison signal; and a combination circuit configured to output the first clock signal by logically combining the control signal with the second comparison signal.

19. The voltage generation circuit according to claim 16, wherein the second clock output circuit includes:

a third comparator configured to output a third comparison signal by comparing the control voltage with the second reference voltage;

a fourth comparator configured to output a fourth comparison signal by comparing the control voltage with the fourth reference voltage;

a switching controller configured to generate a switching control signal based on the third comparison signal and the fourth comparison signal;

a drive controller configured to generate a driving signal based on the third comparison signal and the fourth comparison signal, and to selectively control a filtering signal corresponding to the driving signal based on the switching control signal;

a driver configured to control the filtering signal based on the third comparison signal, the fourth comparison signal, and an output signal of the drive controller;

a pull-down driver configured to pull-down drive an output terminal of the filtering signal in response to an inversion signal of the switching control signal; and a delay circuit configured to output the second clock signal by delaying the filtering signal.

* * * * *